(12) United States Patent
Handa

(10) Patent No.: US 8,413,034 B2
(45) Date of Patent: Apr. 2, 2013

(54) MAGNETIC DATA PROCESSING DEVICE, MAGNETIC DATA PROCESSING METHOD, AND MAGNETIC DATA PROCESSING PROGRAM

(75) Inventor: Ibuki Handa, Iwata (JP)

(73) Assignee: Yamaha Corporation, Hamamatsu-Shi, Shizuoka-Ken (JP)

( * ) Notice: Subject to any disclaimer, the term of this patent is extended or adjusted under 35 U.S.C. 154(b) by 1079 days.

(21) Appl. No.: 12/342,668

(22) Filed: Dec. 23, 2008

(65) Prior Publication Data

US 2009/0172505 A1    Jul. 2, 2009

(30) Foreign Application Priority Data

Dec. 28, 2007 (JP) .................. 2007-339479

(51) Int. Cl.
*G01C 17/38* (2006.01)
*H03M 13/00* (2006.01)

(52) U.S. Cl. ............ 714/799; 714/699; 33/356; 702/85; 702/92; 702/94

(58) Field of Classification Search .............. 33/356; 702/92
See application file for complete search history.

(56) References Cited

U.S. PATENT DOCUMENTS

| | | | | |
|---|---|---|---|---|
| 4,914,387 | A * | 4/1990 | Santos ..................... | 324/166 |
| 7,346,995 | B2 * | 3/2008 | Olson et al. ............... | 33/356 |
| 7,418,359 | B2 | 8/2008 | Handa et al. | |
| 7,905,026 | B2 * | 3/2011 | Martikka et al. ........... | 33/356 |
| 2002/0035791 | A1 * | 3/2002 | Parks et al. ................ | 33/356 |
| 2002/0092188 | A1 * | 7/2002 | Smith ........................ | 33/356 |
| 2003/0167121 | A1 * | 9/2003 | Ockerse et al. ............ | 701/224 |
| 2004/0020064 | A1 * | 2/2004 | Levi et al. ................. | 33/319 |
| 2006/0032064 | A1 | 2/2006 | Sato et al. | |
| 2007/0213950 | A1 * | 9/2007 | Handa ....................... | 702/95 |
| 2008/0266695 | A1 * | 10/2008 | Handa ....................... | 360/43 |
| 2009/0070057 | A1 * | 3/2009 | Hirobe et al. .............. | 702/92 |

FOREIGN PATENT DOCUMENTS

| | | |
|---|---|---|
| CN | 1622193 | 6/2005 |
| CN | 1734236 | 2/2006 |
| EP | 1 643 212 A1 | 4/2006 |
| JP | 5215729 A | 8/1993 |
| JP | 2001080081 A | 3/2001 |
| JP | 2005249619 A | 9/2005 |
| JP | 2006259905 A | 9/2006 |
| JP | 2007-107921 A | 4/2007 |
| JP | 2007-139715 A | 6/2007 |
| JP | 2007-205944 A | 8/2007 |
| JP | 2007199306 A | 8/2007 |

* cited by examiner

OTHER PUBLICATIONS

Japanese Office Action, Patent Application No. 2007-339479, Dispatch date: Aug. 7, 2012.

*Primary Examiner* — Albert Decady
*Assistant Examiner* — Justin R Knapp
(74) *Attorney, Agent, or Firm* — Dickstein Shapiro LLP

(57) ABSTRACT

In a magnetic data processing device, an input part sequentially receives magnetic data output from a magnetic sensor. A storage part stores a plurality of the magnetic data as a data set of statistical population. An index derivation part derives a distribution index of the data set of the statistical population. A reliability determination part determines whether or not reliability of the data set of the statistical population is acceptable based on the distribution index and a decision criterion. A decision criterion setting part increases strictness of the decision criterion when the reliability determination part determines that the reliability of the data set of the statistical population is acceptable, and decreases the strictness of the decision criterion when the reliability determination part determines that the reliability of the data set of the statistical population is unacceptable.

10 Claims, 4 Drawing Sheets

MAGNETIC DATA PROCESSING DEVICE, MAGNETIC DATA PROCESSING METHOD, AND MAGNETIC DATA PROCESSING PROGRAM

BACKGROUND OF THE INVENTION

1. Technical Field of the Invention

The present invention relates to a magnetic data processing device, a magnetic data processing method and a magnetic data processing program, and more particularly to a technology for determining the reliability of magnetic data.

2. Description of the Related Art

Conventionally, a magnetic sensor has been used to measure orientation or the like. When magnetism is measured using a magnetic sensor, the output of the magnetic sensor includes not only components of a measurement target such as Earth's magnetism but also noise or offset components. For example, in the case where Earth's magnetism is measured by a magnetic sensor in a Personal Navigation Device (PND) mounted in a vehicle, the offset component is generated by magnetization of the vehicle or the PND, or is generated by temperature characteristics of the magnetic sensor. The offset component varies as operating environments such as magnetization of the vehicle or temperature vary. Therefore, the output of the magnetic sensor is corrected by subtracting an offset component derived based on the output of the magnetic sensor from the output of the magnetic sensor (for example, see Patent References 1 and 2).

[Patent Reference 1] Japanese Patent Application Publication No. 2007-107921

[Patent Reference 2] Japanese Patent Application Publication No. 2007-139715

However, in the case where Earth's magnetism is measured by a magnetic sensor in a PND mounted in a vehicle, the offset component is caused by a magnetic field generated by an electronic circuit mounted in the vehicle or the PND, or is caused by fluctuations of an output of the magnetic sensor complying with Gaussian distribution. Accordingly, it is difficult to perform correction perfectly negating the noise component. Therefore, in a system using such a magnetic sensor, an error is included in data derived from the output of the magnetic sensor. However, when the output of the magnetic sensor contains a great error or when an error in one magnetic data element is amplified by an error in another magnetic data element, the reliability of the system is significantly reduced. Thus, it is important to determine the reliability of magnetic data output from the magnetic sensor.

Generally, the reliability of magnetic data is determined by comparing an index representing a distribution of the magnetic data with a given threshold.

However, there are the following problems if the reliability of magnetic data is determined using a preset and fixed threshold in the case where the magnitude of the noise component varies depending on the operating environment of the magnetic sensor. That is, in the case where the threshold is set for an environment in which the noise component is small on average, it is often not possible to use the magnetic data (i.e., the rate at which the magnetic data cannot be used is high) in an environment in which the noise component is great on average since it is often determined that the reliability of the magnetic data is unacceptable in the environment in which the noise component is great on average. On the other hand, in the case where the threshold is set for an environment in which the noise component is great on average, the reliability of the system is reduced in an environment in which the noise component is small on average since it is determined that the reliability of magnetic data is acceptable in the environment in which the noise component is small on average even when the reliability of magnetic data is low to the extent that the frequency of use of the magnetic data is not reduced below a practical range even if the magnetic data is determined to be unacceptable.

SUMMARY OF THE INVENTION

Therefore, the present invention has been made to overcome the above problems, and it is an object of the present invention to enable use of magnetic data for which reliability optimal for an operating environment is guaranteed.

A magnetic data processing device for achieving the above object includes an input part for sequentially receiving magnetic data output from a magnetic sensor, a storage part for storing a plurality of the magnetic data as a data set of statistical population, an index derivation part for deriving a distribution index of the data set of statistical population, a reliability determination part for determining whether or not reliability of the data set of statistical population is acceptable based on the distribution index and a decision criterion, and a decision criterion setting part for increasing strictness of the decision criterion when it is determined that the reliability of the data set of statistical population is acceptable and decreasing the strictness of the decision criterion when it is determined that the reliability of the data set of statistical population is unacceptable.

According to the invention, a decision criterion for determining the reliability of a data set of statistical population including a plurality of magnetic data is dynamically set according to the determined reliability. Specifically, the strictness of the decision criterion is increased when it is determined that the reliability is acceptable, and is otherwise decreased when it is determined that the reliability is unacceptable. Accordingly, if it is determined that the reliability is acceptable, the reliability is determined based on a stricter decision criterion afterwards. That is, if it is determined that the reliability of a plurality of magnetic data stored as one data set of statistical population is acceptable after it is determined at a certain time that the reliability of another data set of statistical population is acceptable, then a higher reliability is guaranteed for subsequent data sets of statistical population. Accordingly, highly reliable magnetic data can be used in an operating environment in which the noise component is small on average.

On the other hand, if it is determined that the reliability is unacceptable, the reliability is determined based on a looser decision criterion afterwards. That is, the reliability of a plurality of magnetic data stored as one data set of statistical population after it is determined at a certain time that the reliability of another data set of statistical population is unacceptable is more likely to be determined to be acceptable. This increases the rate (or frequency) at which magnetic data can be used in an operating environment in which the noise component is large on average.

In a simple case, the decision criterion of the reliability may be set in only 2 steps. Practically, the decision criterion is preferably changed in a stepwise manner each time whether or not the reliability of the data set of statistical population is acceptable is determined. That is, it is preferable that the decision criterion of the reliability be set in 3 or more steps and that a decision criterion optimal for the operating environment be set.

If the decision criterion is finely changed in a stepwise manner each time whether or not the reliability of the data set of statistical population is acceptable is determined, the reliability during a short period after the operating environment is significantly changed is determined based on a decision criterion that is too strict or too loose for the changed operating environment. In the case where the settable range of the decision criterion is indefinitely wide, the period required until a decision criterion appropriate for the changed operating environment is set is unnecessarily long. For example, let us assume that, after a very strict decision criterion is set in an operating environment in which the noise component is significantly small, the operating environment is changed to an operating environment in which the noise component is large. If the decision criterion that has been set in the operating environment in which the noise component is significantly small is strict to the extent that it is practically meaningless, time is unnecessarily wasted until a decision criterion suitable for the operating environment in which the noise component is large is set after the operating environment is changed to the operating environment in which the noise component is large. Accordingly, it is preferable that the setting range of the decision criterion of the reliability be previously limited.

If the strictness of the decision criterion is increased or decreased each time whether or not the reliability of the data set of statistical population is acceptable is determined, the rate of the reliability determined to be acceptable statistically converges to 50%. In the case where the decision criterion is set in a stepwise manner, the decision criterion fluctuates in a specific range under the state where the rate of the reliability determined to be acceptable converges to 50%. In a state where the decision criterion converges within a specific range in the case where the steps of the decision criterion are sufficiently fine, it can be considered that the reliability of magnetic data can be determined based on a sufficiently strict decision criterion and the rate of the reliability determined to be acceptable can be increased even when the decision criterion is fixed to the loosest decision criterion in the fluctuating range. On the other hand, if the decision criterion is fixed to a decision criterion slightly looser than the strictest decision criterion in a range under a state where the decision criterion converges within the range in the case where the steps of the decision criterion are sufficiently fine, it can be considered that the reliability of the magnetic data can be determined based on a practically strictest decision criterion in an operating environment. In the case where the decision criterion is fixed, the decision criterion may be fixed to a decision criterion immediately before it is fixed and may be fixed to a new decision criterion which is based on the immediately previous decision criterion.

Although, in the invention, the reliability of magnetic data is determined using both a decision criterion and a distribution index of a data set of statistical population including a plurality of magnetic data, the distribution index of the data set of statistical population used for determination only needs to be an index of a specific indicator representing the reliability of the magnetic data included in the data set of statistical population. A central angle indicating a range of distribution of magnetic data when viewed from the center thereof or any of a variety of indices used in statistics such as variance, a median, a maximum value, a minimum value, and an average can be used as such a distribution index. The distribution index that is directly contrasted with the decision criterion need not be such a mathematically defined value and may be a function of such a value. For example, the index derivation part derives the distribution index as a function of variance of the data set of the statistical population. Otherwise, the index derivation part derives the distribution index as a function of principal values that characterize distribution of the data set of the statistical population. Alternatively, the index derivation part derives the distribution index as a function of a central angle that represents an angular range of distribution of the data set of the statistical population.

There can be considered a variety of methods of using magnetic data whose reliability has been determined according to the invention. Simply, one magnetic data element included in a data set of statistical population that has been determined to be acceptable may be used as data representing the direction or position of an object. More practically, the derivation of an offset of magnetic data based on the data set of statistical population whose reliability has been determined to be acceptable is very efficient. As described above, the offset of magnetic data varies as operating environments such as magnetization of the vehicle or temperature vary and is used for an offset correction process which subtracts an offset component caused by such offset factors from magnetic data. In the case where a great error is included in such an offset, all offset-corrected magnetic data will contain a great error. Therefore, to derive an accurate offset, it is necessary to use, for any operating environment, a data set of statistical population whose reliability has been guaranteed using as strict a decision criterion as possible in the operating environment. Accordingly, deriving an offset of magnetic data based on a data set of statistical population, the reliability of which has been determined to be acceptable, is very efficient.

Although the process for determining whether or not the reliability of the data set of statistical population is acceptable may be any process which finally performs determination based on two values as to whether or not the reliability is acceptable, the speed of the process for determining whether or not the reliability is acceptable increases as the simplicity of the process increases. For this reason, whether or not the reliability of the data set of statistical population is acceptable may be determined based on comparison of the distribution index with a single threshold as the decision criterion.

The magnetic data processing device of the invention may be constructed with or without a magnetic sensor.

The invention also provides a navigation apparatus including the magnetic data processing device, the magnetic sensor, a correction part for correcting the magnetic data based on the offset, and an orientation notification part for providing notification of an orientation based on the corrected magnetic data.

The invention also provides a magnetic data processing method comprising the steps of sequentially receiving magnetic data output from a magnetic sensor, storing a plurality of the magnetic data as a data set of statistical population, deriving a distribution index of the data set of statistical population, determining whether or not reliability of the data set of statistical population is acceptable based on the distribution index and a decision criterion, and increasing strictness of the decision criterion when it is determined that the reliability of the data set of statistical population is acceptable and decreasing the strictness of the decision criterion when it is determined that the reliability of the data set of statistical population is unacceptable.

The invention also provides a magnetic data processing program causing a computer to execute a process comprising the steps of: sequentially receiving magnetic data output from a magnetic sensor; storing a plurality of the magnetic data as a data set of statistical population; deriving a distribution index of the data set of the statistical population; determining whether or not reliability of the data set of the statistical population is acceptable based on the distribution index and a decision criterion; and increasing strictness of the decision criterion when it is determined that the reliability of the data set of the statistical population is acceptable and decreasing the strictness of the decision criterion when it is determined that the reliability of the data set of the statistical population is unacceptable.

The order of the operations described above not limited to that described unless there is a technical problem, and the operations may be performed at the same time or may be performed in a reversed order and need not be performed in the sequential order. The functions of each part described above are implemented by hardware resources whose functions are specified by the configuration itself, hardware resources whose functions are specified by a program, or a combination thereof. The functions of each part are not limited to those implemented by physically independent hardware resources. The invention also provides a machine-readable recording medium containing the magnetic data processing program. Of course, the recording medium containing the magnetic data processing program may be a magnetic recording medium or a magneto-optical recording medium and may be any other recording medium developed in the future.

DETAILED DESCRIPTION OF THE INVENTION

Figure 1:
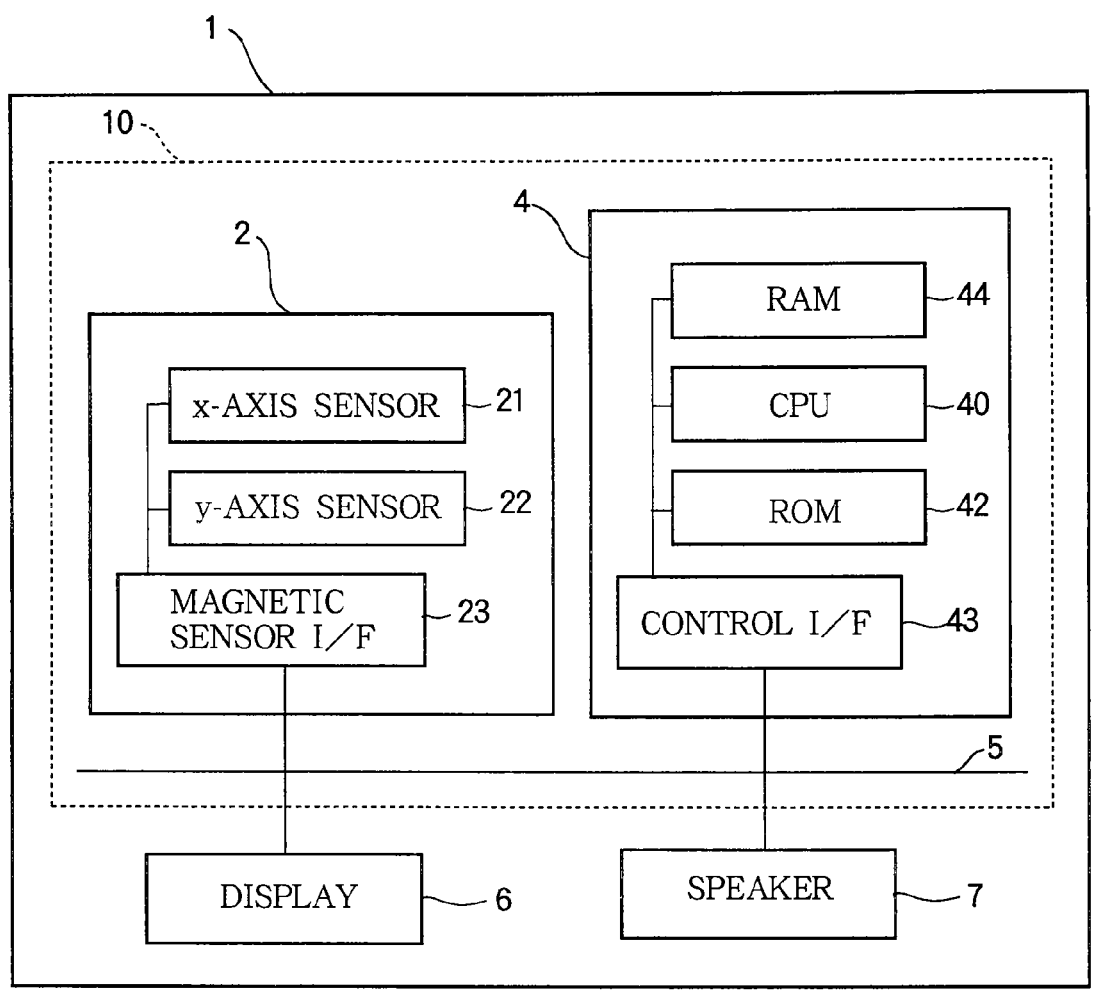
FIG. 1 is a block diagram illustrating an embodiment of the invention.

The embodiments of the invention will now be described in detail with reference to the accompanying drawings. Corresponding components in the drawings will be denoted by the same reference numeral and redundant descriptions thereof will be omitted.

1. Hardware Structure
2. Software Structure
3. Overview of Magnetic Data Processing Method
4. Distribution Index
5. Setting of Decision Criterion
6. Offset Derivation
7. Other Embodiments
1. Hardware Structure FIG. 1 is a block diagram illustrating an embodiment of a navigation apparatus according to the invention. The navigation apparatus 1 acquires the magnitudes of magnetic fields of 2 orthogonal (x, y) directions to detect the direction of the Earth's magnetism and notifies a user of the detected direction of the Earth's magnetism. The navigation apparatus 1 is a PND mounted in a vehicle such as an automobile.

The magnetic data processing device 10 includes a magnetic sensor 2 and a controller 4. The controller 4 receives magnetic data from the magnetic sensor 2 and notifies the driver of a travel direction or an expected travel route determined based on offset-corrected magnetic data using image information or voice information. An image indicating the travel direction or the expected travel route is displayed on a display 6 that is controlled by the controller 4. A sound indicating the travel direction or the expected travel route is output from a speaker 7 that is controlled by the controller 4.

The magnetic sensor 2 includes an x-axis sensor 21 and a y-axis sensor 22 that detect x-direction and y-direction components of a magnetic vector. The x-axis sensor 21 and the y-axis sensor 22 each include a magnetic resistance element, a hall element, or the like and may each be any type of directional 1D magnetic sensor. The x-axis sensor 21 and the y-axis sensor 22 are fixed such that sensitivity directions thereof are orthogonal to each other. Outputs of the x-axis sensor 21 and the y-axis sensor 22 are input in a time division manner to a magnetic sensor interface 23. The magnetic sensor interface 23 amplifies signals received from the x-axis sensor 21 and the y-axis sensor 22 and then performs analog to digital conversion on the amplified signals. Digital magnetic data output from the magnetic sensor interface 23 is input to the controller 4 through a bus 5.

The controller 4 is a computer that includes a CPU 40, a ROM 42, a RAM 44, and a control interface 43. The CPU 40 is a processor that is responsible for overall control of the navigation apparatus 1. The controller 4 transmits and receives data to and from peripheral devices such as the magnetic sensor 2 through the control interface 43. The ROM 42 is a machine-readable and nonvolatile storage medium that stores a magnetic data processing program executed by the CPU 40 and a variety of programs for implementing functions of the navigation apparatus. The RAM 44 is a volatile storage medium that temporarily stores data to be processed by the CPU 40. The magnetic data processing device 10 and the magnetic sensor 2 may be constructed as a one-chip magnetic data processing device.

2. Software Structure

Figure 2:
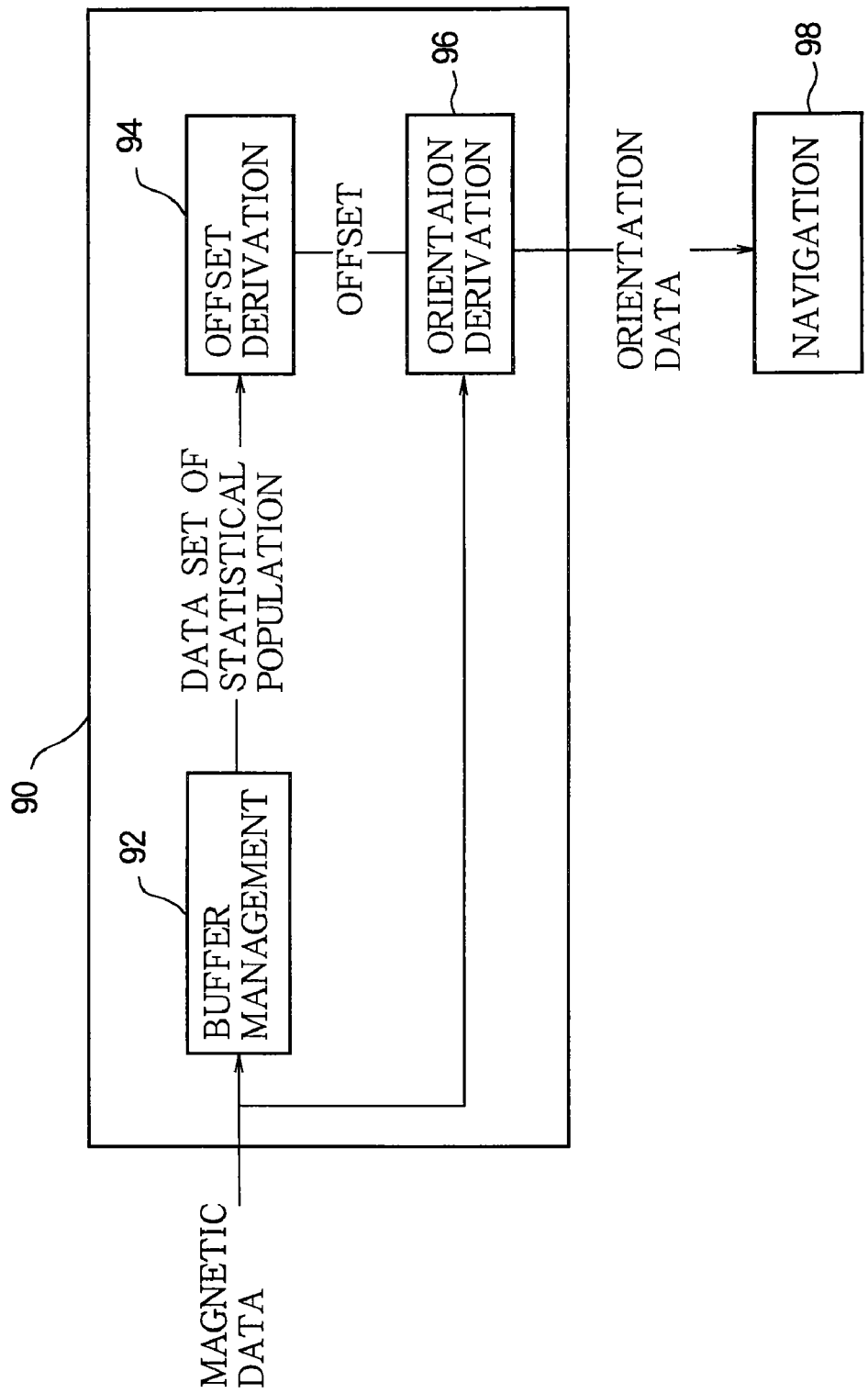
FIG. 2 is a block diagram illustrating the embodiment of the invention.

FIG. 2 is a block diagram illustrating a configuration of a magnetic data processing program 90. The magnetic data processing program 90 is a program for outputting orientation data to a navigation program 98 and is stored in the machine-readable ROM 42. The orientation data is vector data indicating the direction of Earth's magnetism (i.e., Earth's magnetic field). The magnetic data processing program 90 includes a group of modules such as a buffer management module 92, an offset derivation module 94, and an orientation derivation module 96.

The buffer management module 92 is a program module for receiving magnetic data, which is sequentially output from the magnetic sensor 2, and storing the received magnetic data in a buffer in order to use the received magnetic data for updating the offset. Thus, the buffer management module 92 causes the controller 4 to function as both an input part and a storage part. A set of magnetic data stored in the RAM 44 as a buffer is a data set of statistical population.

The offset derivation module 94 is a program module for deriving a new offset based on the data set of statistical population stored in the buffer management module 92, and updating an old offset with the new offset. Thus, the offset derivation module 94 causes the controller 4 to function as an index derivation part, a reliability determination part, a decision criterion setting part, and an offset derivation part. When the old offset is updated with the new offset, the new offset becomes an old offset. Therefore, the old offset is simply referred to as an "offset" in contexts not causing misunderstanding. Actually, the offset used for orientation data correction is set as one variable and the new offset is derived as a different variable and the different variable is set as the variable used for orientation data correction when the new offset is derived.

The orientation derivation module 96 is a program module for correcting magnetic data sequentially output from the magnetic sensor 2 using the offset stored in the offset derivation module 94 to generate orientation data. Thus, the orientation derivation module 96 causes the controller 4 to function as a correction part. Specifically, the orientation derivation module 96 subtracts components of the offset from components of magnetic data which is vector data and outputs the vector data, from which the offset has been subtracted, as orientation data.

The navigation program 98 is a well-known program for notifying the driver of the direction of turning at an expected intersection for turning based on current location information, map information, and a current travel orientation represented by the orientation data. Thus, the navigation program 98 causes the controller 4 to function as an orientation notification part. The orientation data may be used only to notify the driver of the north, south, east and west travel directions through characters, an arrow, or voice and may also be used to perform a heading-up process on a map displayed on the display 6.

3. Overview of Magnetic Data Processing Method

Figure 3:
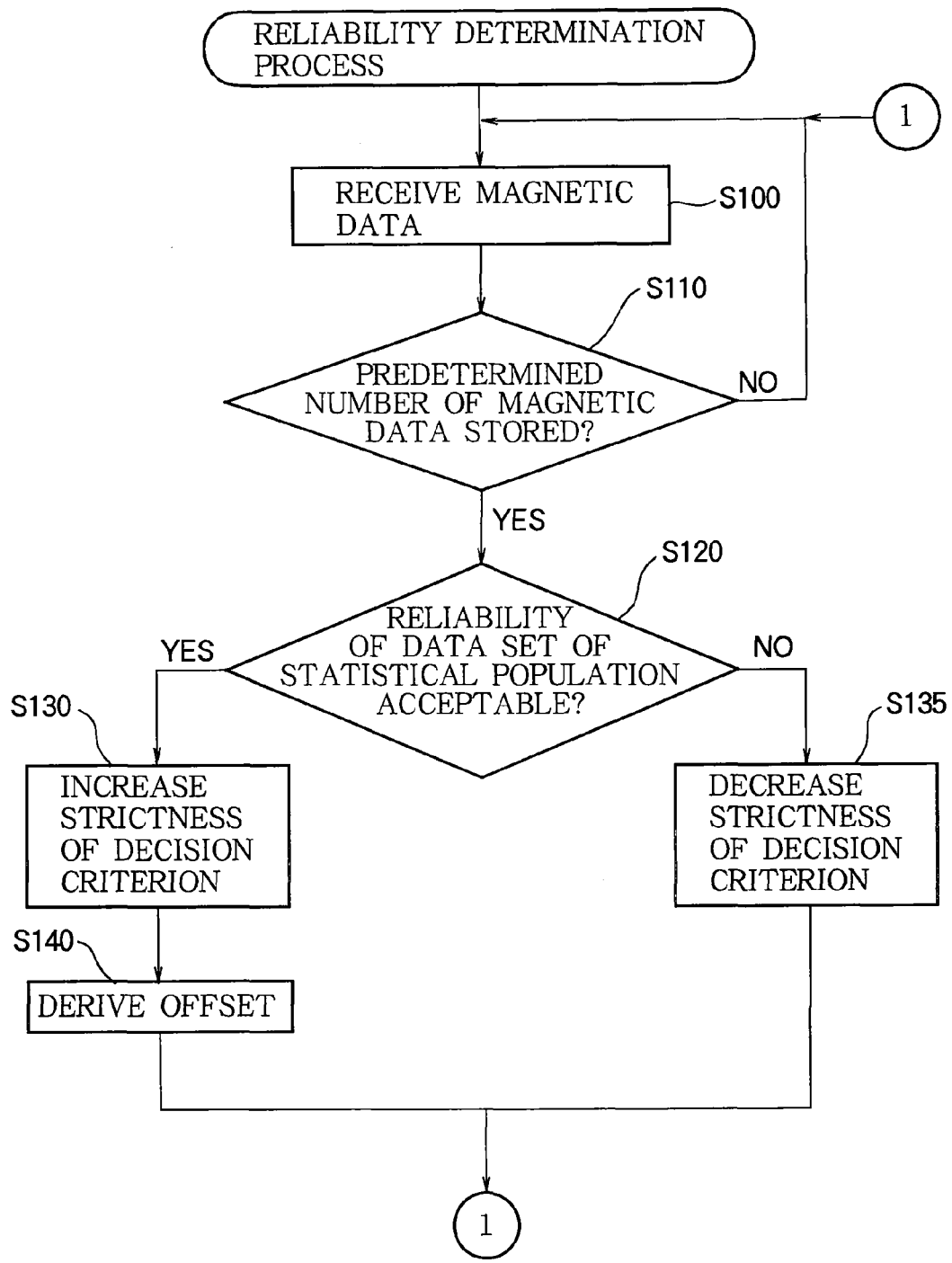
FIG. 3 is a flow chart illustrating the embodiment of the invention.

FIG. 3 is a flow chart illustrating a process for determining the reliability of magnetic data in order to derive an offset. The process illustrated in FIG. 3 is performed as the CPU 40 executes the buffer management module 92 and the offset derivation module 94 when an offset update request has been issued. The offset update request may be issued at regular time intervals or may be issued in response to an explicit instruction from the driver.

First, at step S100, the buffer management module 92 receives and stores magnetic data used to derive a new offset in a buffer. If the buffer management module 92 sequentially receives magnetic data from the magnetic sensor 2 at short time intervals when the travel direction of the automobile changes little, the distance between two consecutively received magnetic data is small. Storing a plurality of magnetic data at a small distance from each other in a buffer with a limited capacity wastes memory resources and causes unnecessary buffer update processes. In addition, if a new offset is derived based on a set of magnetic data at a small distance therebetween, there is a possibility that a new offset with low accuracy may be derived based on a data set of statistical population having a biased distribution. Therefore, the need to update the buffer may be determined in the following manner. For example, if the distance between magnetic data most recently stored in the buffer and last received magnetic data is smaller than a given threshold, it is determined that there is no need to update the buffer and the last received magnetic data is discarded without being stored in the buffer.

Then, at step S110, the buffer management module 92 determines whether or not a predetermined number of magnetic data required to derive a new offset has been stored in the buffer. That is, the number of elements of the data set of statistical population has been predetermined. The processes of steps S100 and S110 are repeated until the predetermined number of magnetic data are stored in the buffer.

When the predetermined number of magnetic data have been stored in the buffer, the offset derivation module 94 determines whether or not the reliability of the data set of statistical population is acceptable (step S120). Specifically, the offset derivation module 94 derives a distribution index of the data set of statistical population based on the data set of statistical population and determines the reliability of the data set of statistical population based on both the distribution index and a decision criterion.

When it is determined that the reliability of the data set of statistical population is acceptable, the offset derivation module 94 increases the strictness of the decision criterion (step S130). The offset derivation module 94 derives a new offset based on the data set of statistical population and then erases the data set of statistical population (step S140). That is, when it is determined that the reliability of the data set of statistical population is acceptable, the offset derivation module 94 sets a stricter decision criterion for subsequent determinations as to whether or not the reliability is acceptable.

When it is determined that the reliability of the data set of statistical population is unacceptable, the offset derivation module 94 decreases the strictness of the decision criterion (step S135). That is, when it is determined that the reliability of the data set of statistical population is unacceptable, the offset derivation module 94 sets a looser decision criterion for subsequent determinations as to whether or not the reliability is acceptable. In this case, no new offset is derived and the data set of statistical population is simply discarded.

When the process of step S140 or S135 is completed, the procedure returns to the process of step S100 to repeat the processes described above. The orientation derivation module 96 derives orientation data based on a latest offset and magnetic data while updating the offset with the new offset that is derived through the above procedure as needed and outputs the orientation data to the navigation program 98.

4. Distribution Index

The distribution index described above may be any index of a specific indicator representing the reliability of the magnetic data included in the data set of statistical population. The following are three specific examples.

(1) Variance

Variance of magnetic data output from the magnetic sensor 2 decreases as the noise component decreases. Accordingly, it can be considered that the reliability of a data set of statistical population with a large variance is low and the reliability of a data set of statistical population with a small variance is high. Here, a function of the variance is used as the distribution index although the variance of magnetic data could be directly used as the distribution index. Specifically, when a data set of statistical population $q_i$ is represented by the following Equation (1) with the number and the center of a plurality of magnetic data included in the data set of statistical population being "N" and "$c(c_x, c_y)$" and the buffer being "Q":

$$q_i = (q_{ix}, q_{iy}) \ (i=0,1,2 \ldots) \qquad (1),$$

the distribution index is represented by "S" defined as in the following Equation (3).

$$r = \sqrt{\frac{1}{N} \sum_{q_i \in Q} \|q_i - c\|^2} \qquad (2)$$

$$S = \frac{1}{Nr^2} \sum_{q_i \in Q} (\|q_i - c\| - r)^2 \qquad (3)$$

The reliability of the data set of statistical population can be determined by comparing the distribution index S derived in this manner with a threshold $S_t$, which is the decision criterion. That is, it may be determined that the reliability is unacceptable when $S > S_t$, otherwise it may be determined that the reliability is acceptable. This enables high-speed processing since whether or not the reliability is acceptable is determined simply by comparing the two values.

(2) Eigenvalues of Distribution

In the case where an offset is derived from a determined number of magnetic data, the accuracy of the offset is low if the distribution range of the data set of statistical population is narrow since a noise component is included in the magnetic data. Accordingly, the reliability of a data set of statistical population as a set of magnetic data used to derive an offset should be determined such that the reliability of a data set of statistical population with a narrow distribution range is low and the reliability of a data set of statistical population with a wide distribution range is high. Use of a predetermined number of magnetic data as a data set of statistical population can be considered use of a set of magnetic data stored within a predetermined period as a data set of statistical population. A data set of statistical population with a wide distribution is stored in a situation where the travel direction of a vehicle with the navigation apparatus 1 attached thereto significantly changes in a short time. For example, a data set of statistical population, the distribution of which is wide on average is stored in a situation where the vehicle runs on a mountain road. In this situation, it is preferable that a highly accurate offset be derived by increasing the strictness of the criterion for determining that the reliability of the data set of statistical population is acceptable as much as possible.

Since the magnetic data is distributed near a circle or a sphere centered on the offset, the ratio between the length of a principal axis of the distribution of the data set of statistical population and the length of an axis perpendicular to the principal axis gets closer to 1 as the width of the distribution of the magnetic data increases. If the ratio between the length of the principal axis of the distribution of the data set of statistical population and the length of the axis perpendicular to the principal axis is used as a distribution index, the ratio of eigenvalues $\lambda_2/\lambda_1$ of a matrix A defined as in the following Equation (4) may be used as the distribution index S. Specifically, the principal values of the distribution of the data set of statistical population represented by Equation (1) are eigenvalues of the symmetrical matrix A that is defined as in Equations (4), (5), and (6) using the sum of vectors, each of which starts with the center of the data set of statistical population and ends with corresponding magnetic data.

$$A = X^T X, \quad (4)$$
where $$X = \begin{bmatrix} (q_0 - \bar{q})^T \\ (q_1 - \bar{q})^T \\ (q_2 - \bar{q})^T \\ \cdots \\ (q_{N-1} - \bar{q})^T \end{bmatrix} \quad (5)$$

$$\bar{q} = \frac{1}{N} \sum_{i=0}^{N-1} q_i \quad (6)$$

The matrix A is N times a variance-covariance matrix since the matrix A can be written as in Equation (7).

$$A = \sum_{i=0}^{N-1} (q_i - \bar{q})(q_i - \bar{q})^T \quad (7)$$

(3) Central Angle of Distribution

The reliability of a data set of statistical population as a set of magnetic data used to derive an offset can also be determined such that the reliability of the data set of statistical population increases as the maximum value of the angle between two line segments connecting the center of the data set of statistical population to two arbitrary magnetic data elements in the data set of statistical population gets closer to 180°. Here, let us assume that the maximum value of the angle between the two line segments is the central angle of the distribution. In the case where the central angle of the distribution or a function thereof is used as the distribution index, the inner product of vectors, which start with the two magnetic data elements forming the central angle and end with the center of the distribution, may be used as the distribution index S.

5. Setting of Decision Criterion

The decision criterion set at the above steps S130 and S135 is the single threshold $S_t$. The frequency of update of the offset or the accuracy of the offset varies depending on the method for obtaining the threshold $S_t$. FIG. 4A to FIG. 4D are graphs illustrating relations between the method for obtaining the threshold $S_t$, the frequency of update of the offset, and the accuracy of the offset.

Figure 4A:
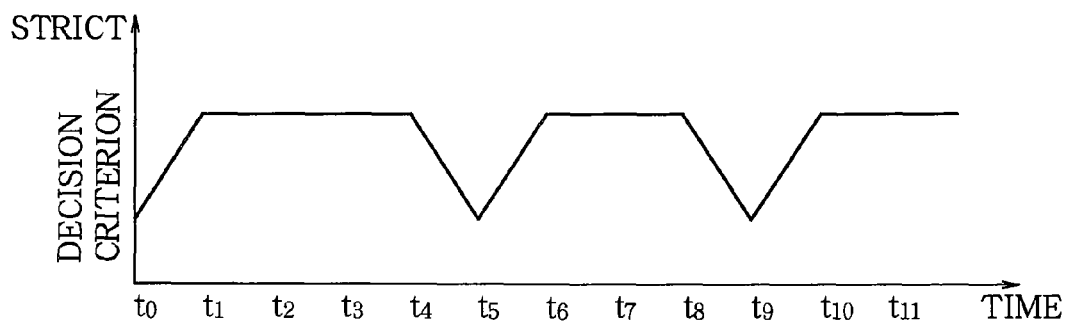
FIGS. 4A to 4D are graphs illustrating the embodiment of the invention.

FIG. 4A illustrates changes of a level of the decision criterion in the case where two values are obtained as the threshold $S_t$ which is the decision criterion. When a relatively strict threshold $S_t$ has been set in the case where two threshold values $S_t$ are obtained, the threshold $S_t$ is not changed even if the reliability of the data set of statistical population is acceptable. When a relatively loose threshold $S_t$ has been set, the threshold $S_t$ is not changed even if the reliability of the data set of statistical population is unacceptable. In the example illustrated in FIG. 4A, it is determined that the reliability of the data set of statistical population is acceptable at times excluding time $t_4$ and $t_8$ in a period from time $t_0$ to $t_{11}$. At times $t_1$, $t_2$, $t_3$, $t_6$, $t_7$, $t_{10}$, and $t_{11}$, the reliability of the data set of statistical population is determined to be acceptable according to a strict decision criterion. At times $t_0$, $t_5$, and $t_9$, the reliability of the data set of statistical population is determined to be acceptable according to a loose decision criterion.

Figure 4B:
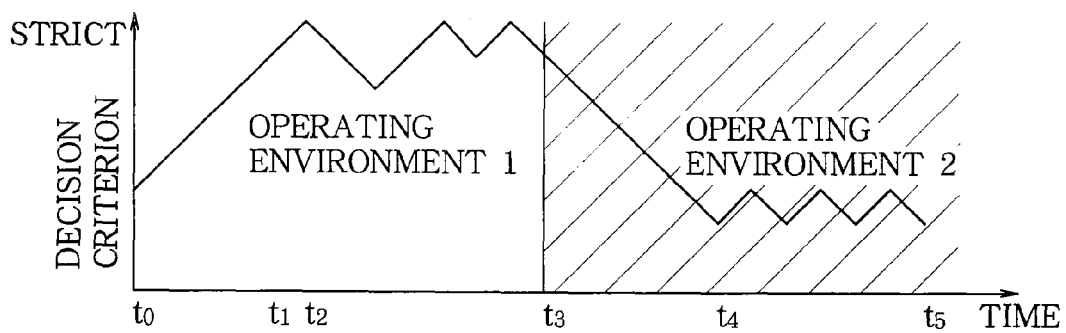

FIG. 4B illustrates changes of the decision criterion in the case where a number of steps are set as the threshold $S_t$ which is the decision criterion and the threshold $S_t$ changes in a stepwise manner each time whether or not the reliability of the data set of statistical population is acceptable is determined. In this case, if the reliability is kept acceptable during a period between time $t_0$ at which an initial value of the threshold $S_t$ is set and time $t_1$, the strictness of the decision criterion is continuously and gradually increased from time $t_0$ to time $t_1$. In a period up to time $t_3$ at which the operating environment is changed after the reliability becomes unacceptable at time $t_2$, the threshold $S_t$ fluctuates in a range near each of the values of the thresholds $S_{t1}$ and $S_{t2}$ which are decision criteria at times $t_1$ and $t_2$.

As a method for increasing the strictness of the threshold $S_t$ in a stepwise manner, a positive constant may be added to the threshold $S_t$, or the threshold $S_t$ may be multiplied by a positive constant greater than 1 in the case where the strictness of the decision criterion increases as the threshold $S_t$ increases. A positive constant may be subtracted from the threshold $S_t$ or the threshold $S_t$ may be multiplied by a positive constant less than 1 in the case where the strictness of the decision criterion increases as the threshold $S_t$ decreases. As a method for decreasing the strictness of the threshold $S_t$ in a stepwise manner, a positive constant may be subtracted from the threshold $S_t$ or the threshold $S_t$ may be multiplied by a positive constant less than 1 in the case where the strictness of the decision criterion decreases as the threshold $S_t$ decreases. A positive constant may be added to the threshold $S_t$ or the threshold $S_t$ may be multiplied by a positive constant greater than 1 in the case where the strictness of the decision criterion decreases as the threshold $S_t$ increases.

Here, let us assume that, at time $t_3$, the operating environment of the navigation apparatus 1 has changed from an operating environment 1 in which the noise component is very small to an operating environment 2 in which the noise component is very large. Then, as shown in FIG. 4B, a threshold $S_{t3}$ is set as a very strict decision criterion at time $t_3$ and therefore it is necessary to wait a very long time until a threshold $S_t$ suitable for the operating environment 2 in which the noise component is very large is set at time $t_4$. Thus, during the period from time $t_3$ to $t_4$, the reliability of the data set of statistical population is determined to be unacceptable and therefore the offset is not updated even though the operating environment has been changed. It is preferable that the offset be quickly updated, for example when the ambient temperature has been changed, or when the ambient magnetization state of the navigation apparatus 1 has been changed since the navigation apparatus 1 has been detached from one vehicle and then attached to another.

Figure 4C:
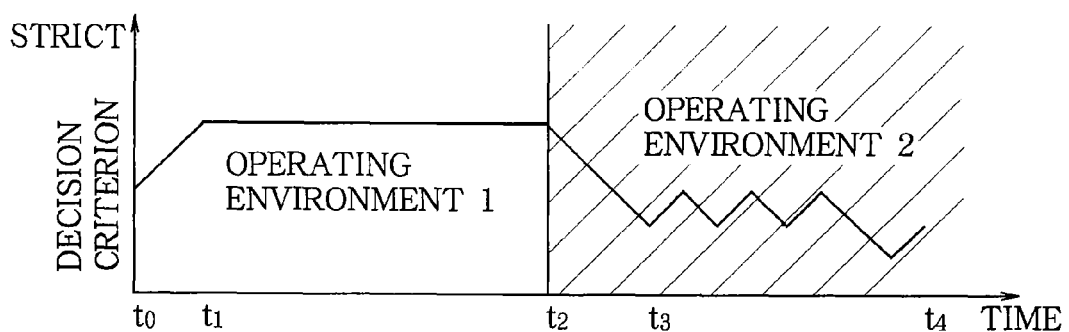

Thus, it is preferable that the range of the threshold $S_t$ used as a decision criterion be preset or limited. FIG. 4C illustrates changes of the decision criterion in the case where a limit value that can be set for the threshold $S_t$ at the strict side is preset. FIG. 4C also illustrates changes of the decision criterion in the case where the operating environment changes in the same manner as in FIG. 4B. In this case, when the threshold $S_t$ is set to an upper limit $S_f$ at time $t_1$, the threshold which is the decision criterion is fixed to the constant value $S_f$ until the operating environment is changed from the operating environment 1 to the operating environment 2. This reduces the time required until a threshold suitable for the operating environment 2 is set after the operating environment is changed to the operating environment 2 since the threshold $S_f$ is less than that of time $t_3$ shown in FIG. 4B. In addition, in the configuration wherein the fixed threshold $S_f$ is compared with a variance function of the distribution of the data set of statistical population, the rate of the reliability determined to be acceptable is 100% during a period from time $t_1$ to time $t_2$ in the case where the noise component is small to the extent that the reliability is determined to be acceptable even when the determination is made always based on the threshold $S_f$ in the operating environment 1. That is, an advantage in that the frequency of update of the offset is high is also achieved in this case.

Figure 4D:
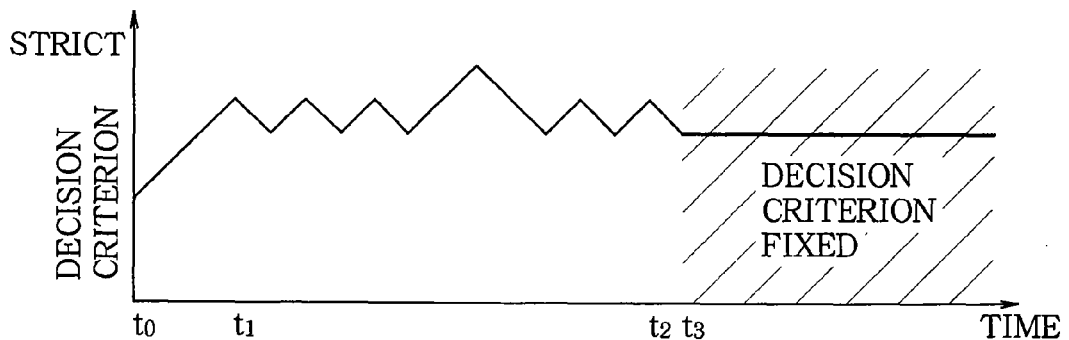

If the threshold $S_t$, which is the decision criterion, is set in a range suitable for the operating environment, the threshold $S_t$ fluctuates within a small range. However, in this state, the acceptance rate is statistically 50%. In a configuration wherein the threshold $S_t$ can be set in sufficiently small steps, the threshold $S_t$ may be fixed after the threshold $S_t$ starts fluctuating, i.e., after the threshold $S_t$ converges within a small range. For example, in a state in which the threshold $S_t$ has converged within a relatively strict range as shown in FIG. 4D, it can be considered the reliability of magnetic data can be determined based on a sufficiently strict decision criterion and the rate of the reliability determined to be acceptable can be increased even when the threshold $S_t$ is fixed to the loosest threshold in the fluctuating range. On the other hand, if the threshold $S_t$ is fixed to a value slightly looser than the strictest value in a range in which the threshold $S_t$ fluctuates, it can be considered that the reliability of the magnetic data can be determined based on a practically strictest decision criterion. Whether or not the threshold $S_t$ has converged within a small range can be determined by calculating whether or not the ratio between the reliability determined to be acceptable and the reliability determined to be unacceptable has become close to 50% while the reliability is determined in a predetermined number of times or by calculating whether or not the variance of a threshold $S_t$ derived while the reliability is determined in a predetermined number of times has been reduced below a certain level.

6. Offset Derivation

The Inventor has suggested a method for deriving an offset of magnetic data based on a data set of statistical population including a plurality of magnetic data sequentially received from the magnetic sensor 2 (see Japanese Patent Application Publications Nos. 2007-240270, 2007-205944, 2007-139715, and 2007-107921). The method for deriving an offset from a data set of statistical population, the reliability of which has been determined to be acceptable, may or may not be a statistical method. The following is an example of the statistical method.

When the data set of statistical population includes 3 magnetic data that are not in the same line, a circle on which the data set of statistical population is distributed is uniquely specified without using the statistical method. A position vector $c=(c_x, c_y)$ of the center of the circle is obtained by solving simultaneous equations (8). Although the number of equality constraints is 3 for 2 variables, the equations (8) must have a solution since one of the 3 equality constraints is redundant.

$$\begin{bmatrix} (q_0 - \bar{q})^T \\ (q_1 - \bar{q})^T \\ (q_2 - \bar{q})^T \end{bmatrix} c = \frac{1}{2} \begin{bmatrix} q_0^T q_0 - R \\ q_1^T q_1 - R \\ q_2^T q_2 - R \end{bmatrix}, \quad (8)$$

where $$R = \frac{1}{N} \sum_{i=0}^{N-1} q_i^T q_i \quad (9)$$

Let us define j according to the following Equation (10) when the number of elements of the data set of statistical population is 4 or more.

$$j = \frac{1}{2} \begin{bmatrix} q_0^T q_0 - R \\ q_1^T q_1 - R \\ q_2^T q_2 - R \\ \cdots \\ q_{N-1}^T q_{N-1} - R \end{bmatrix} \quad (10)$$

Here, if simultaneous linear equations (11) for "c" have a solution, the solution is the center of the circle on which the data set of statistical population is distributed.

$$Xc=j \quad (11)$$

However, when measurement errors of the magnetic sensor 2 are taken into consideration, the equation (11) cannot actually have a solution. Thus, let us introduce a vector "e" defined as in the following equation (12) in order to obtain a feasible solution using the statistical method.

$$e=Xc-j \quad (12)$$

The value of "c" which minimizes $\|e\|_2^2$ (i.e., $e^T e$) is likely to be the center of a circle, to which the data set of statistical population is distributed nearest. When the matrix A is regular, the problem of obtaining the value of "c" which minimizes $\|e\|_2^2$ is an optimization problem of minimizing an objective function of the following Equation (13).

$$f(c)=(Xc-j)^T(Xc-j) \quad (13)$$

That is, the value of "c" which minimizes the objective function f(c) of Equation (13) is derived as a new offset. The value of "c" which minimizes the objective function f(c) can be written as the following Equation (14) when $X^TX$ is regular as assumed in this embodiment.

$$c=(X^TX)^{-1}X^Tj \qquad (14)$$

7. Other Embodiments

The scope of the invention is not limited to the above embodiments and a variety of modifications can be made without departing from the scope of the invention. For example, the invention is equally applied to 3D magnetic data. In addition, the invention is not limited to the magnetic data processing device for measuring Earth's magnetism and may be applied to a magnetic data processing device for measuring magnetism other than Earth's magnetism. Further, although the navigation apparatus to which the invention is applied is exemplified by a Portable Navigation Device (PND), the invention may be applied to a stationary navigation device that is installed in a vehicle after the vehicle is completed or a pedestrian navigation device.

The invention claimed is:

1. A magnetic data processing device comprising:
an input part configured to sequentially receive magnetic data output from a magnetic sensor;
a storage part configured to store a plurality of the magnetic data as a data set of a statistical population;
an index derivation part configured to derive a distribution index of the data set of the statistical population;
a reliability determination part configured to determine whether or not reliability of the data set of the statistical population is acceptable based on the distribution index and a decision criterion;
an offset derivation part configured to derive an offset of the magnetic data based on the data set of the statistical population when the reliability determination part determines that the reliability of the data set of the statistical population is acceptable, and configured not to derive an offset of the magnetic data when the reliability of the data set of the statistical population is unacceptable; and
a decision criterion setting part configured to increase strictness of the decision criterion when the reliability determination part determines that the reliability of the data set of the statistical population is acceptable and configured to decrease the strictness of the decision criterion when the reliability determination part determines that the reliability of the data set of the statistical population is unacceptable,
wherein the decision criterion setting part is configured to change the decision criterion in a stepwise manner each time the reliability determination part determines whether or not the reliability of the data set of the statistical population is acceptable,
wherein the decision criterion setting part is configured to fix the decision criterion when the decision criterion converges within a predetermined range, and
wherein the decision criterion setting part is configured to determine whether or not the decision criterion converges within the predetermined range according to a ratio between a number of times of determination in which the reliability is determined to be acceptable and a number of times of determination in which the reliability is determined to be unacceptable while the reliability is determined by the reliability determination part a predetermined number of times.

2. The magnetic data processing device according to claim 1, wherein the decision criterion setting part is configured to limit a range of the decision criterion such that the decision criterion is changed stepwise within the limited range.

3. The magnetic data processing device according to claim 1, wherein the index derivation part is configured to derive the distribution index as a function of variance of the data set of the statistical population.

4. The magnetic data processing device according to claim 1, wherein the index derivation part is configured to derive the distribution index as a function of principal values that characterize distribution of the data set of the statistical population.

5. The magnetic data processing device according to claim 1, wherein the index derivation part is configured to derive the distribution index as a function of a central angle that represents an angular range of distribution of the data set of the statistical population.

6. The magnetic data processing device according to claim 1, wherein the decision criterion setting part is configured to set the decision criterion as a single threshold value, and the reliability determination part is configured to determine the reliability of the data set of the statistical population based on comparison of a value of the distribution index with the single threshold value.

7. The magnetic data processing device according to claim 1, wherein the magnetic sensor is configured to output the magnetic data.

8. A navigation apparatus comprising:
a magnetic sensor configured to output magnetic data;
an input part configured to sequentially receive the magnetic data output from the magnetic sensor;
a storage part configured to store a plurality of the magnetic data as a data set of statistical population;
an index derivation part configured to derive a distribution index of the data set of the statistical population;
a reliability determination part configured to determine whether or not reliability of the data set of the statistical population is acceptable based on the distribution index and a decision criterion;
a decision criterion setting part configured to increase strictness of the decision criterion when the reliability determination part determines that the reliability of the data set of the statistical population is acceptable and configured to decrease the strictness of the decision criterion when the reliability determination part determines that the reliability of the data set of the statistical population is unacceptable;
an offset derivation part configured to derive an offset of the magnetic data based on the data set of the statistical population when the reliability determination part determines that the reliability of the data set of the statistical population is acceptable, and configured not to derive an offset of the magnetic data set when the reliability determination part determines that the reliability of the data set of the statistical population is unacceptable;
a correction part configured to correct the magnetic data based on the offset; and
an orientation notification part configured to provide notification of an orientation based on the corrected magnetic data,
wherein the decision criterion setting part is configured to change the decision criterion in a stepwise manner each time the reliability determination part determines whether or not the reliability of the data set of the statistical population is acceptable,
wherein the decision criterion setting part is configured to fix the decision criterion when the decision criterion converges within a predetermined range, and
wherein the decision criterion setting part is configured to determine whether or not the decision criterion converges within the predetermined range according to a ratio between a number of times of determination in which the reliability is determined to be acceptable and a number of times of determination in which the reliability is determined to be unacceptable while the reliability is determined by the reliability determination part a predetermined number of times.

9. A magnetic data processing method comprising:

sequentially receiving magnetic data output from a magnetic sensor;

storing a plurality of the magnetic data as a data set of statistical population;

deriving a distribution index of the data set of the statistical population;

determining whether or not reliability of the data set of the statistical population is acceptable based on the distribution index and a decision criterion;

deriving an offset of the magnetic data based on the data set of the statistical population when the reliability of the data set of the statistical population is determined to be acceptable, and not deriving an offset of the magnetic data when the reliability of the data set of the statistical population is determined to be unacceptable;

increasing strictness of the decision criterion when it is determined that the reliability of the data set of the statistical population is acceptable and decreasing the strictness of the decision criterion when it is determined that the reliability of the data set of the statistical population is unacceptable;

changing the decision criterion in a stepwise manner each time determining whether or not reliability of the data set of the statistical population is acceptable is performed;

determining whether or not the decision criterion converges within a predetermined range according to a ratio between a number of times of determination in which the reliability is determined to be acceptable and a number of times of determination in which the reliability is determined to be unacceptable while the determination is performed a predetermined number of times; and fixing the decision criterion when the decision criterion converges within the predetermined range.

10. A machine readable non-transitory medium containing a magnetic data processing program causing a computer to execute a process of:

sequentially receiving magnetic data output from a magnetic sensor;

storing a plurality of the magnetic data as a data set of statistical population;

deriving a distribution index of the data set of the statistical population;

determining whether or not reliability of the data set of the statistical population is acceptable based on the distribution index and a decision criterion;

deriving an offset of the magnetic data based on the data set of the statistical population when the reliability of the data set of the statistical population is determined to be acceptable, and not deriving an offset of the magnetic data when the reliability of the data set of the statistical population is determined to be unacceptable;

increasing strictness of the decision criterion when it is determined that the reliability of the data set of the statistical population is acceptable and decreasing the strictness of the decision criterion when it is determined that the reliability of the data set of the statistical population is unacceptable;

changing the decision criterion in a stepwise manner each time determination is performed as to whether or not the reliability of the data set of the statistical population is acceptable;

determining whether or not the decision criterion converges within a predetermined range according to a ratio between a number of times of determination in which the reliability is determined to be acceptable and a number of times of determination in which the reliability is determined to be unacceptable while the determination is performed a predetermined number of times; and fixing the decision criterion when the decision criterion converges within the predetermined range.

* * * * *